(12) United States Patent
Lai et al.

(10) Patent No.: US 9,488,913 B2
(45) Date of Patent: Nov. 8, 2016

(54) PHOTORESIST HAVING DECREASED OUTGASSING

(71) Applicant: TAIWAN SEMICONDUCTOR MANUFACTURING COMPANY, LTD., Hsin-Chu (TW)

(72) Inventors: Wei-Han Lai, New Taipei (TW); Ching-Yu Chang, Yuansun Village (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/516,681

(22) Filed: Oct. 17, 2014

(65) Prior Publication Data

US 2016/0108170 A1    Apr. 21, 2016

(51) Int. Cl.
*G03F 7/30*    (2006.01)
*G03F 7/039*    (2006.01)
*G03F 7/038*    (2006.01)

(52) U.S. Cl.
CPC ........... *G03F 7/0382* (2013.01); *G03F 7/0392* (2013.01); *G03F 7/30* (2013.01)

(58) Field of Classification Search
None
See application file for complete search history.

(56) References Cited

U.S. PATENT DOCUMENTS

| 4,752,552 | A | * | 6/1988 | Aoai | 430/191 |
| 5,120,629 | A | * | 6/1992 | Bauer et al. | 430/70 |
| 5,780,188 | A | * | 7/1998 | Rolson | 430/30 |
| 2002/0058205 | A1 | * | 5/2002 | Nakashima et al. | 430/285.1 |
| 2006/0292489 | A1 | * | 12/2006 | Lee et al. | 430/270.1 |
| 2012/0107742 | A1 | * | 5/2012 | Lee et al. | 430/270.1 |

FOREIGN PATENT DOCUMENTS

| JP | 2002060475 A | * | 2/2002 |
| JP | 2012-063728 A | * | 3/2012 |
| WO | WO-2009/105667 A2 | * | 8/2009 |

OTHER PUBLICATIONS

English translation of JP2002-60475 , A (2002) from machine translation from AIPN Japan Patent Office National Center for Industrial Property Information and Training, generated Jul. 5, 2015, 16 pages.*
English translation of JP2012-63728 , A (2012) from machine translation from AIPN Japan Patent Office National Center for Industrial Property Information and Training, generated Jun. 29, 2015, 137 pages.*

* cited by examiner

*Primary Examiner* — Cynthia Hamilton
(74) *Attorney, Agent, or Firm* — Haynes and Boone, LLP

(57) ABSTRACT

Provided is a method of fabricating a semiconductor device. A substrate is provided. A material layer is formed over the substrate. A photoresist layer is formed over the material layer. The photoresist layer contains a polymer. The polymer includes an acid labile group (ALG) that is linked to a plurality of carboxylic acid function groups. The photoresist layer is then patterned using a lithography process, for example an extreme ultraviolet (EUV) lithography process.

20 Claims, 5 Drawing Sheets

PHOTORESIST HAVING DECREASED OUTGASSING

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Various photolithography processes may need to be performed to fabricate these increasingly small ICs. A photoresist material is used in the photolithography processes. In particular, the photoresist material is often used to pattern the ICs and is removed after the patterning is complete. However, as lithography processes continue to evolve, existing photoresist materials may have performance shortcomings. For example, photolithography processes usually include a post-exposure bake (PEB) step. The PEB step may produce outgassing of a polymer acid labile group (ALG) in conventional photoresist materials. ALG outgassing may contaminate lithography tools and may degrade lithography performance.

Therefore, while existing photoresist materials have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
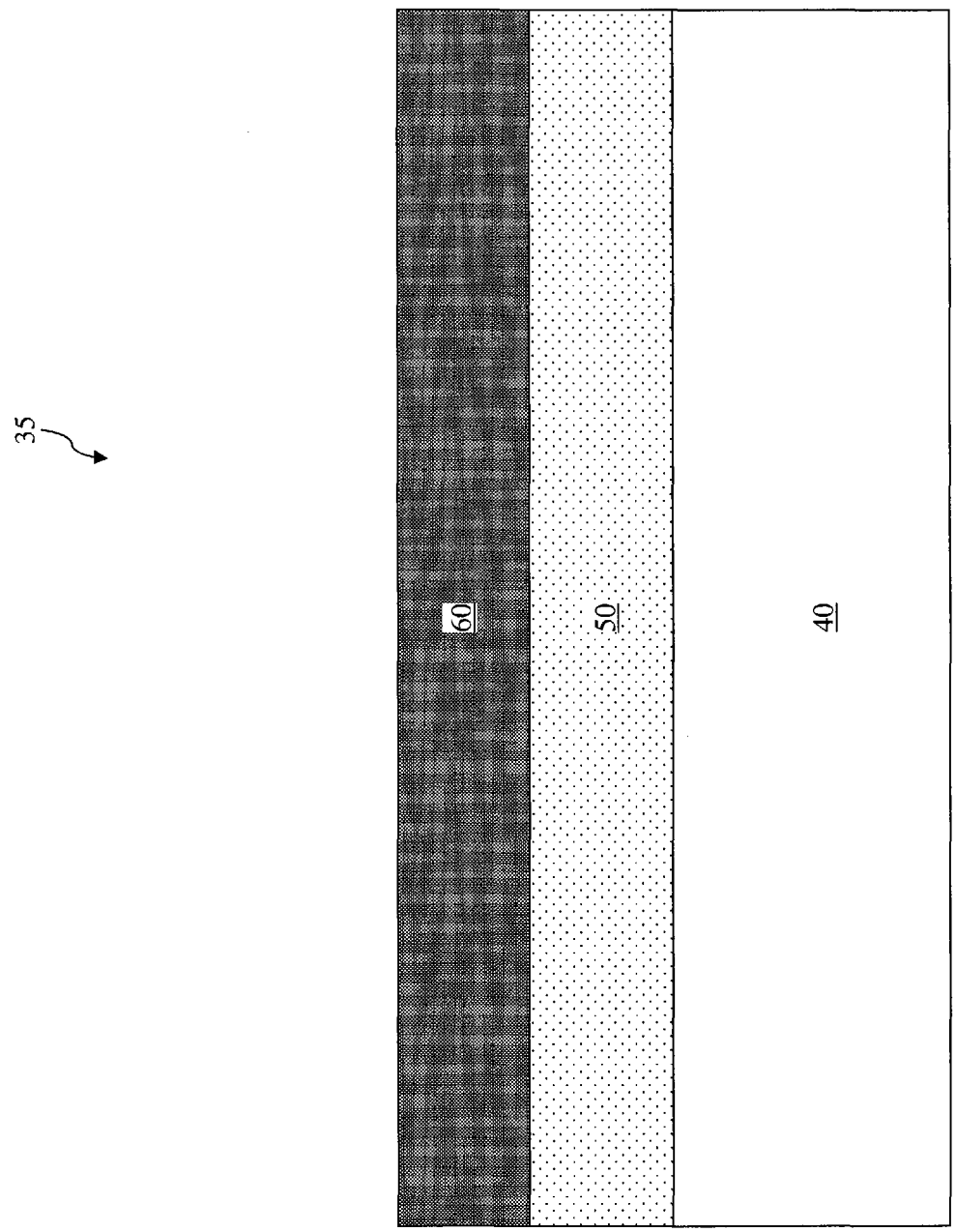
FIGS. 1 and 4 are diagrammatic cross-sectional side views of a semiconductor device at various stages of fabrication in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 4:
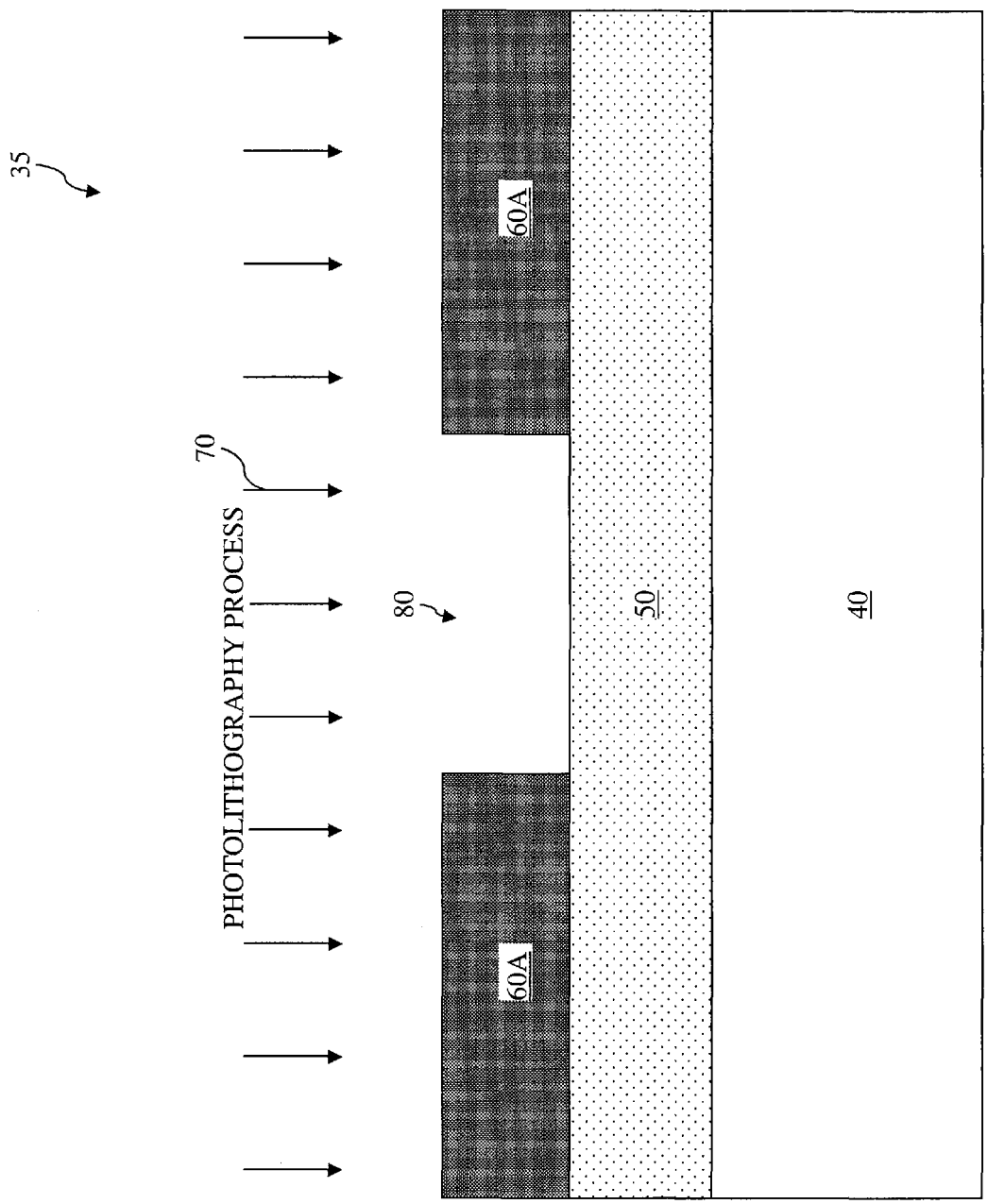

FIGS. 1 and 4 are diagrammatic fragmentary cross-sectional side views of a semiconductor device 35 at various stages of fabrication in accordance with various aspects of the present disclosure. The semiconductor device 35 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Referring to FIG. 1, the semiconductor 35 includes a substrate 40. In some embodiments, the substrate 40 is a silicon substrate doped with a p-type dopant such as boron (for example a p-type substrate). Alternatively, the substrate 40 could be another suitable semiconductor material. For example, the substrate 40 may be a silicon substrate that is doped with an n-type dopant such as phosphorous or arsenic (an n-type substrate). The substrate 40 could include other elementary semiconductors such as germanium and diamond. The substrate 40 could optionally include a compound semiconductor and/or an alloy semiconductor. Further, the substrate 40 could include an epitaxial layer (epi layer), may be strained for performance enhancement, and may include a silicon-on-insulator (SOI) structure.

In some embodiments, the substrate 40 is substantially conductive or semi-conductive. The electrical resistance may be less than about 103 ohm-meter. In some embodiments, the substrate 40 contains metal, metal alloy, or metal nitride/sulfide/selenide/oxide/silicide with the formula $MX_a$, where M is a metal, and X is N, S, Se, O, Si, and where "a" is in a range from about 0.4 to 2.5. For example, the substrate 40 may contain Ti, Al, Co, Ru, TiN, $WN_2$, or TaN.

In some other embodiments, the substrate 40 contains a dielectric material with a dielectric constant in a range from about 1 to about 40. In some other embodiments, the substrate 40 contains Si, metal oxide, or metal nitride, where the formula is $MX_b$, wherein M is a metal or Si, and X is N or O, and wherein "b" is in a range from about 0.4 to 2.5. For example, the substrate 40 may contain $SiO_2$, silicon nitride, aluminum oxide, hafnium oxide, or lanthanum oxide.

A material layer 50 is formed over the substrate 40. In an embodiment, the material layer 50 includes a dielectric material, such as silicon oxide or silicon nitride. In another embodiment, the material layer 50 includes metal. In yet another embodiment, the material layer 50 includes a semiconductor material.

In some embodiments, the material layer 50 has different optical properties than photoresist. For example, the material layer 50 has a different n, k, or T value from photoresist. In some embodiments, the material layer 50 comprises at least one of different polymer structure, acid labile molecule, PAG (photo acid generator) loading, quencher loading, chromophore, cross linker, or solvent, which lead to different n value to photoresist. In some embodiments, the material layer 50 and photoresist have different etching resistance. In some embodiments, the material layer 50 contains an etching resistant molecule. The molecule includes low onishi number structure, double bond, triple bond, silicon, silicon nitride, Ti, TiN, Al, aluminum oxide, SiON, or combinations thereof.

It is understood that the substrate 40 and the material layer 50 may each include other suitable material compositions in other embodiments.

A photoresist material 60 is formed over the material layer 50. In the embodiment shown in FIG. 2, the photoresist material 60 includes a positive photoresist, but it is understood that the photoresist material 60 may be a negative photoresist in alternative embodiments. The photoresist material 60 may be formed by a spin-coating process. The photoresist material 60 includes a polymer, photo acid generators (PAG), quenchers, chromophore, solvent, surfactant, cross linker, etc. In an embodiment, the photo acid generator is bonded to the polymer. In a subsequent photolithography process (described in more detail later), photons induce decomposition of the PAG. As a result, a small amount of acid is formed, which further induces a cascade of chemical transformations in the photoresist material 60. The photoresist material 60 may also optionally include a quencher that is disposed within the photoresist material 60 in order to improve critical dimension (CD) control.

Photoresist may be developed using either a positive-tone developer process (PTD) or a negative tone developer process (NTD). For both PTD and NTD, the polymer of the photoresist needs a chemical amplification resist reaction (CAR) to produce polar switch and patterning. However, the CAR reaction may lead to certain undesirable side effects. For example, the polymer in conventional photoresist contains an acid labile group (ALG). The ALG leaves the photoresist with the help of photo acid in a post exposure bake (PEB) step of a lithography process to pattern the photoresist. This is referred to as ALG outgassing.

ALG outgassing may be undesirable as it may be a source of contamination for extreme ultraviolet (EUV) lithography. The contamination of EUV lithography tools result in lower production throughput. ALG outgassing during the PEB process may also produce high film stress, which may lead to an undesirable rounding or footing profile for the photoresist pattern. However, one function served by the ALG is that it protects carboxylic acid. For conventional photoresist polymer design, one ALG monomer corresponds to, or is linked with, one carboxylic acid function group. As such, to ensure the carboxylic function group is adequately protected by ALG, ALG outgassing may be significant, thereby leading to unsatisfactory photoresist patterning performance, especially in EUV lithography.

According to the various aspects of the present disclosure, the polymer in the photoresist material 60 is an acid-cleavable polymer and has a novel design such that each ALG monomer generates, or is linked to, a plurality of carboxylic function groups. By doing so, the same number of carboxylic function groups can be protected by a smaller number of ALG monomers. In turn, ALG outgassing is reduced, which improves lithography performance by reducing contamination for EUV tools and by reducing film stress. Consequently, production throughput is improved, and pattern profiles are enhanced (e.g., straighter pattern features, and lower film loss). In addition, the novel polymer design allows the baking temperature in the PEB process to be tuned in order to achieve a higher contrast or a lower contrast, where a higher contrast is good for critical dimension uniformity (CDU), and a lower contrast is good for depth of focus (DOF).

Figure 2:
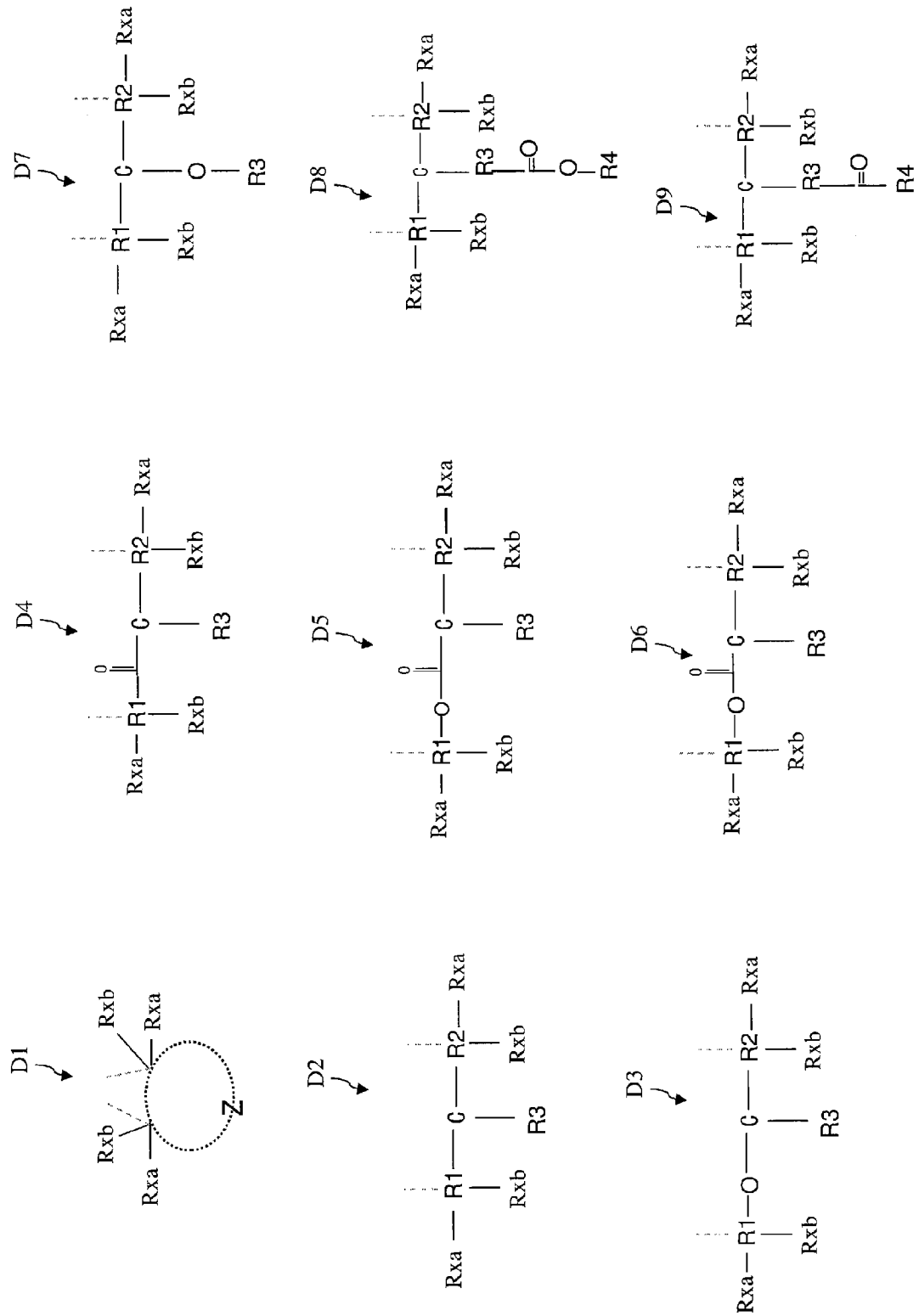
FIGS. 2-3 illustrate chemical formulas of a portion of a polymer of a photoresist material in accordance with some embodiments.
Figure 3:
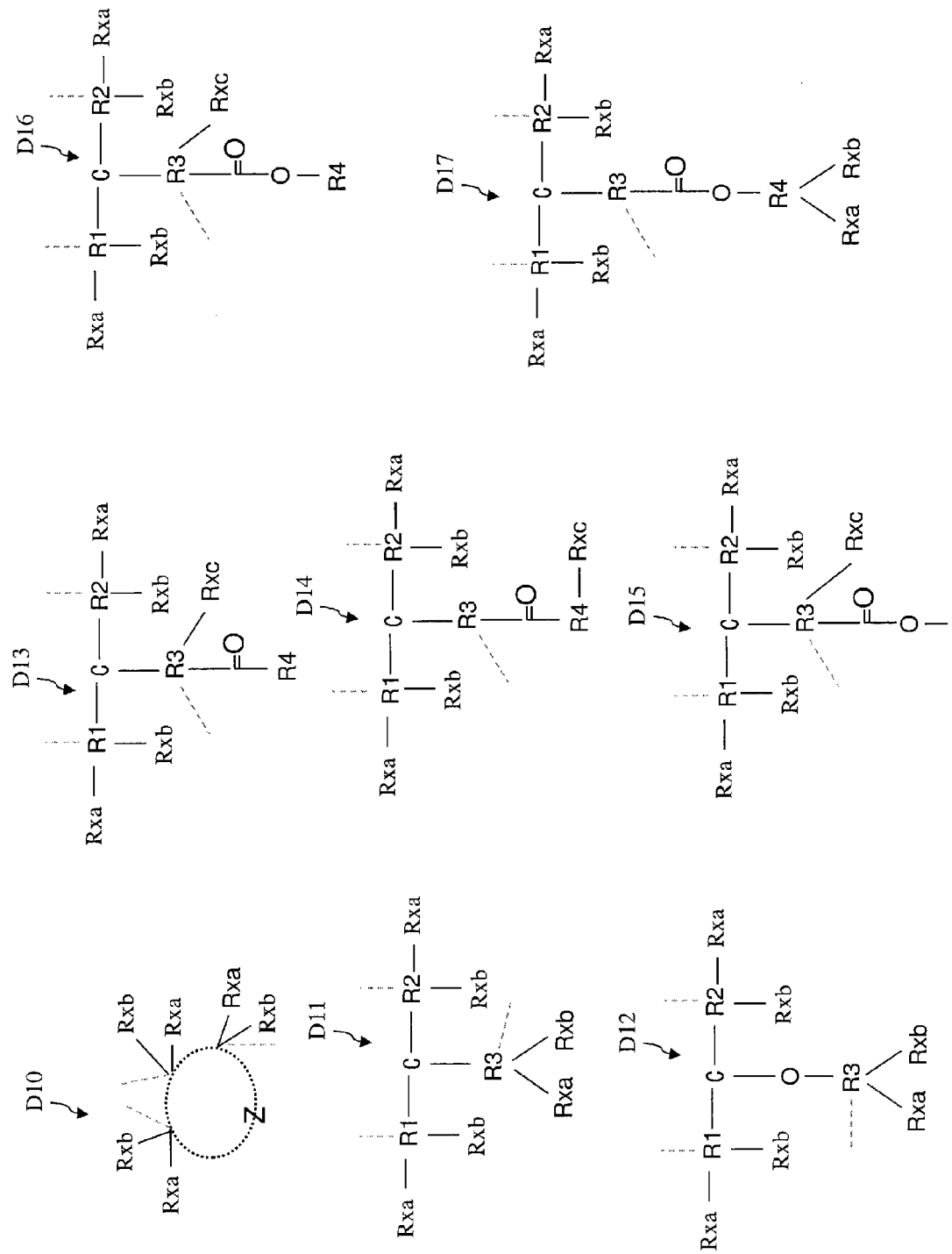

FIGS. 2-3 illustrate chemical formulas for a plurality of embodiments D1-D17 of the ALG according to various aspects of the present disclosure. In embodiments D1-D9, each ALG monomer is linked to (or protects) two respective carboxylic acid function groups. In embodiments D10-D17, each ALG monomer is linked to (or protects) three respective carboxylic acid function groups.

Referring to FIGS. 2-3, the D1 embodiment of the ALG has the following chemical formula:

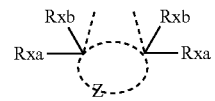

The D2 embodiment of the ALG has the following chemical formula:

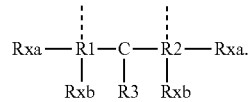

The D3 embodiment of the ALG has the following chemical formula:

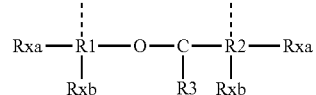

The D4 embodiment of the ALG has the following chemical formula:

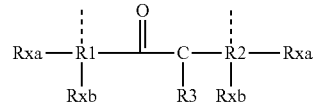

The D5 embodiment of the ALG has the following chemical formula:

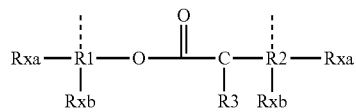

The D6 embodiment of the ALG has the following chemical formula:

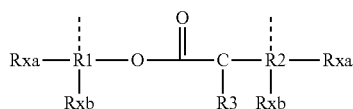

The D7 embodiment of the ALG has the following chemical formula:

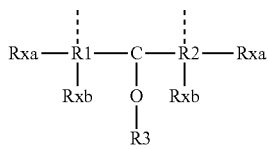

The D8 embodiment of the ALG has the following chemical formula:

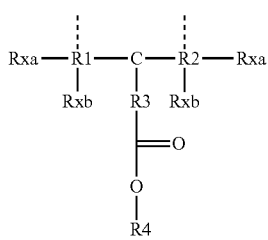

The D9 embodiment of the ALG has the following chemical formula:

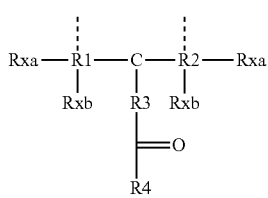

The D10 embodiment of the ALG has the following chemical formula:

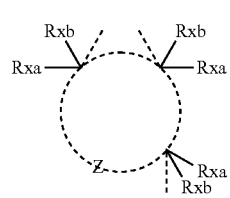

The D11 embodiment of the ALG has the following chemical formula:

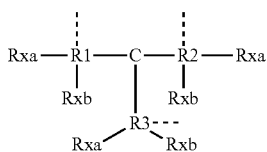

The D12 embodiment of the ALG has the following chemical formula:

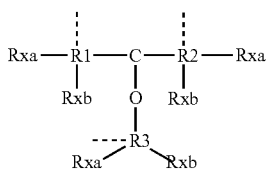

The D13 embodiment of the ALG has the following chemical formula:

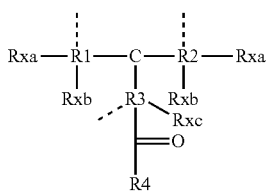

The D14 embodiment of the ALG has the following chemical formula:

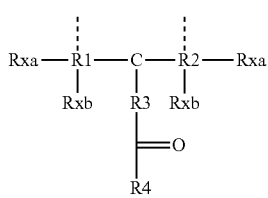

The D15 embodiment of the ALG has the following chemical formula:

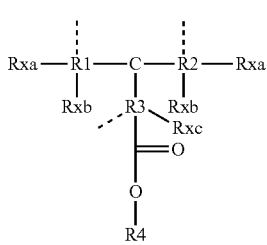

The D16 embodiment of the ALG has the following chemical formula:

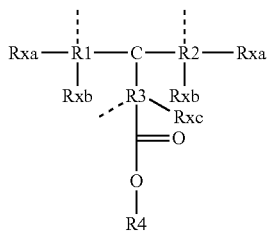

The D17 embodiment of the ALG has the following chemical formula:

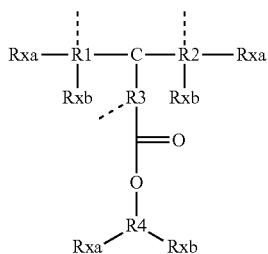

In each of the embodiments D1-D17, Z represents a C4~C15 cyclic alkyl or cyclic alkyl derivative or 3D structure. R1, R2, R3, and R4 each represent a respective C1~C15 alkyl group. Rxa, Rxb, and Rxc each represent an alkyl group having a carbon number between 1~10. In addition, for each of the embodiments D1-D17, the broken/dashed lines each represent a link to a respective carboxylic acid group. For example, in the embodiments D1, two carboxylic acid function groups are linked to Z. In the embodiments D2-D9, a carboxylic acid function group is linked to R1, and another carboxylic acid function group is linked to R2. In the embodiments D10, three carboxylic acid function groups are linked to Z. In the embodiments D11-D17, a carboxylic acid function group is linked to R1, another carboxylic acid function group is linked to R2, and yet another carboxylic acid function group is linked to R3. In some embodiments, the polymer has a molecular weight in a range from about 1000 to about 20000.

Referring now to FIG. 4, a photolithography process 70 is performed on the photoresist material 60 to form a patterned photoresist layer 60A having an opening 80. The photolithography process 70 may include an EUV lithography process. In some embodiments, the lithography process uses a light source (or illumination source) that has a wavelength less than about 250 nm, for example about 13.5 nm. In some embodiments, the illumination source has at least one of: KrF, ArF, EUV, or E-beam. The light sources exposes a predetermined region (corresponding to the opening 80) of the photoresist material 60, while other regions of the photoresist material 60 are protected through the use of a photomask (not illustrated).

The photolithography process may include, among other things, an optical exposure process and a post-exposure baking (PEB) process. In some embodiments, the polymer of the photoresist material 60 having the ALG discussed above is an acid cleavable polymer. The PAG of the photoresist material 60A will release such acid after optical exposure. The acid released by the PAG will cleave the polymer in the PEB process. The polymer cleaving releases the ALG, i.e., creating ALG outgassing. Thus, the ALG may also be referred to as a cleaved group. In some embodiments, the cleaved group can be C4-C25 alkyl group, cycloalkyl group, hydroxylalkyl group, alkoxy group, or alkoxyl alkyl group. The structure of the cleaved group can be long chain, cyclic, or a 3D structure. In some embodiments, the cleave group at least contains 3% in polymer platform. As discussed above, each ALG monomer is linked to a plurality of (e.g., two or three or more) carboxylic function groups. As such, the outgassing of ALG is reduced for the same amount of carboxylic acid, which leads to enhanced pattern contrast and imaging performance.

After the acid cleaves the polymer, the polymer becomes more hydrophilic, which means the polymer may not be dissolved by organic solvent such as conventional butyl acetate. According to the various aspects of the present disclosure, the polymer (after becoming more hydrophilic) may be dissolved by a basic solution, such as TMAH having a concentration between about 2% and 3%.

After the patterned photoresist layer 60A is formed, one or more fabrication processes such as an etching process or an implantation process may be performed, using the patterned photoresist layer 60A as a mask. Thereafter, the patterned photoresist layer 60A may be removed by a photoresist removal process known in the art, such as a stripping or an ashing process.

Figure 5:
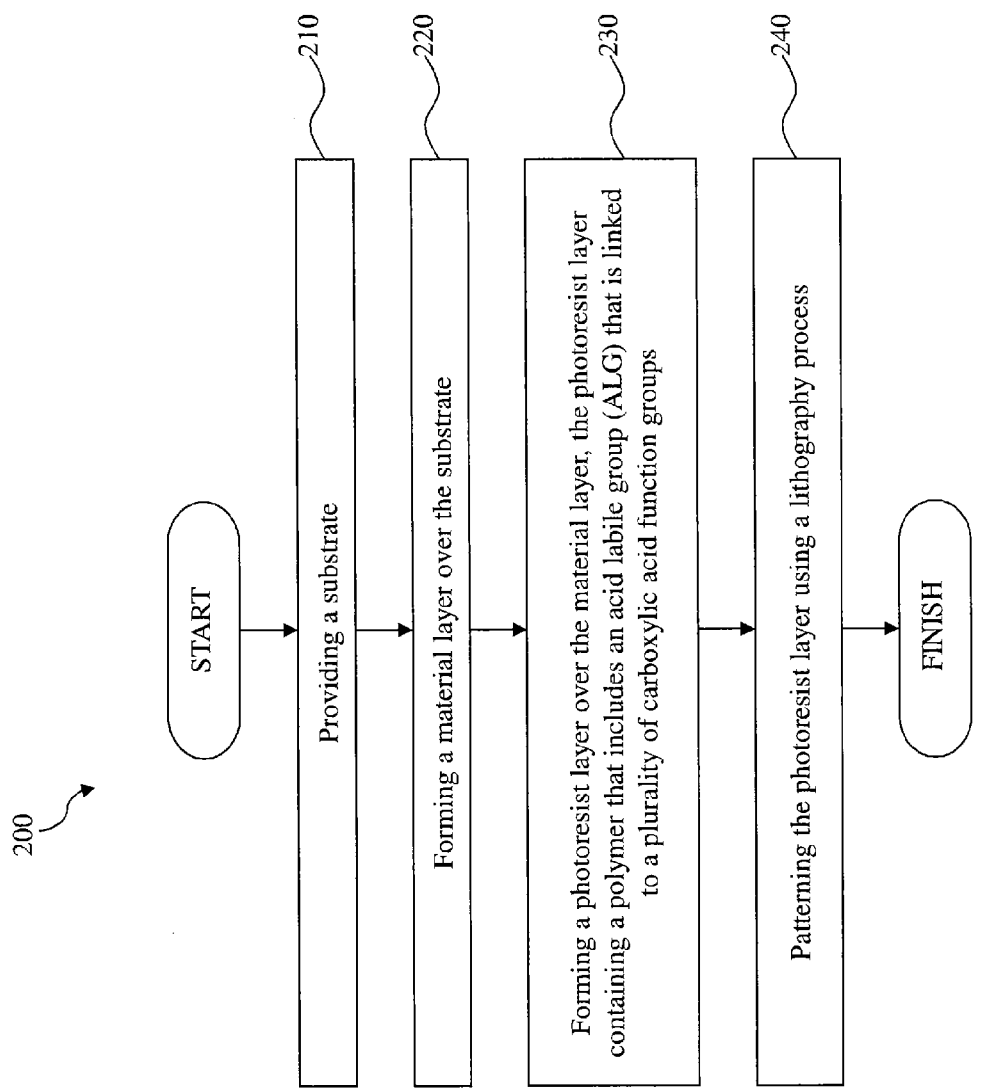
FIG. 5 is a flowchart illustrating a method for fabricating a semiconductor device according to various aspects of the present disclosure.

FIG. 5 is a flowchart of a method 200 of forming a semiconductor pattern according to various aspects of the present disclosure. The method 200 may be performed by a lithography process, for example by an extreme ultraviolet (EUV) lithography process in some embodiments.

The method 200 includes a step 210 of providing a substrate. In some embodiments, the substrate is substantially conductive or semi-conductive. The electrical resistance may be less than about 103 ohm-meter. In some embodiments, the substrate contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 40 may contain Ti, Al, Co, Ru, TiN, WN$_2$, or TaN. In some other embodiments, the substrate contains a dielectric material with a dielectric constant in a range from about 1 to about 40. In some other embodiments, the substrate contains Si, metal oxide, or metal nitride, where the formula is MXb, wherein M is a metal or Si, and X is N or O, and wherein "b" is in a range from about 0.4 to 2.5. For example, the substrate may contain SiO$_2$, silicon nitride, aluminum oxide, hafnium oxide, or lanthanum oxide.

The method 200 includes a step 220 of forming a material layer over the substrate. In some embodiments, the material layer has different optical properties than photoresist. For example, the material layer has a different n, k, or T value from photoresist. In some embodiments, the material layer comprises at least one of different polymer structure, acid labile molecule, PAG (photo acid generator) loading, quencher loading, chromophore, cross linker, or solvent, which lead to different n value to photoresist. In some embodiments, the material layer and photoresist have different etching resistance. In some embodiments, the material layer contains an etching resistant molecule. The molecule includes low onishi number structure, double bond, triple bond, silicon, silicon nitride, Ti, TiN, Al, aluminum oxide, SiON, or combinations thereof.

The method 200 includes a step 230 of forming a photoresist layer over the material layer. The photoresist layer contains a polymer that includes an acid labile group (ALG)

that is linked to a plurality of carboxylic acid function groups. For example, the ALG may include one of the following chemical formulas:

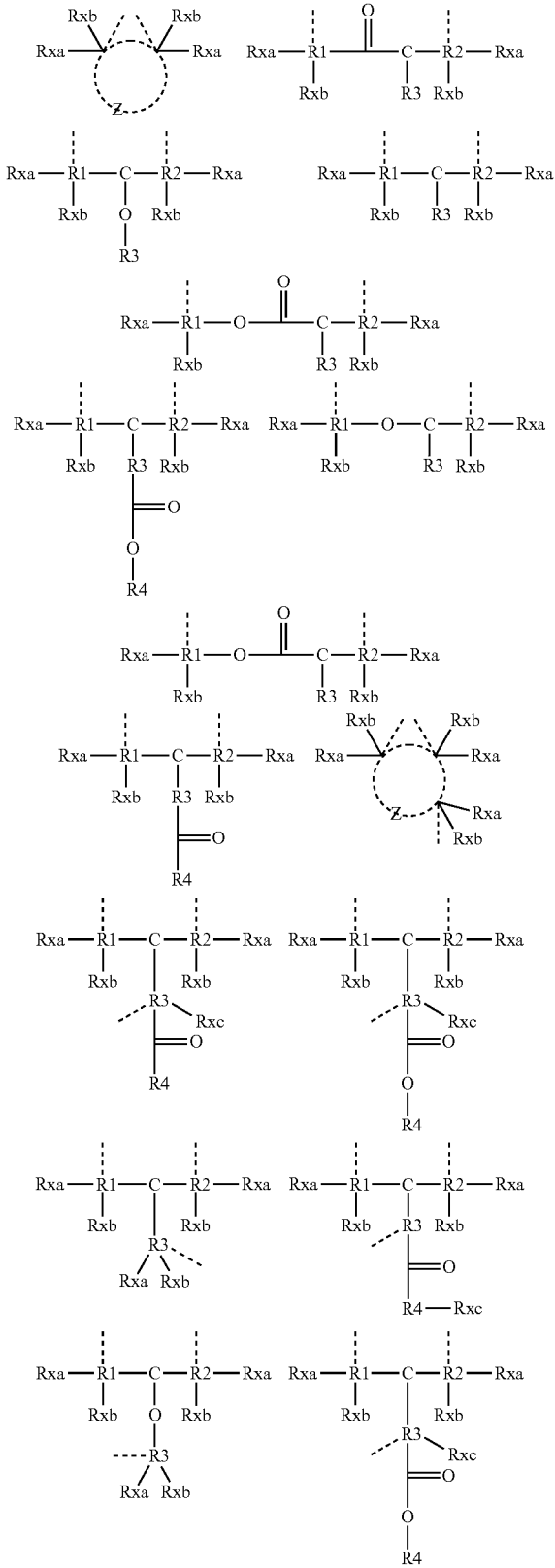
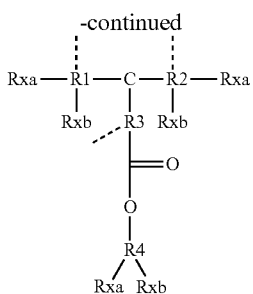

Where Z represents a C4~C15 cyclic alkyl or cyclic alkyl derivative or 3D structure, R1, R2, R3, and R4 each represent a respective C1~C15 alkyl group, and Rxa, Rxb, and Rxc each represent an alkyl group having a carbon number between 1~10.

The method 200 includes a step 240 of patterning the photoresist layer using a lithography process. As a part of the lithography process, the PAG of the photoresist material releases acid after optical exposure. The acid released by the PAG will cleave the polymer of the photoresist in the PEB process. The polymer cleaving causes outgassing of the ALG. Since each ALG monomer is linked to a plurality of (e.g., two or three) carboxylic function groups, the outgassing of ALG is reduced for the same amount of carboxylic acid, which leads to enhanced pattern contrast and imaging performance. After the acid cleaves the polymer, the polymer becomes more hydrophilic, and the polymer (after becoming more hydrophilic) may be dissolved by a basic solution, such as TMAH having a concentration between about 2% and 3%.

It is understood that additional processes may be performed before, during, or after the steps 210-240 of the method 200 to complete the fabrication of the semiconductor device. For reasons of simplicity, these additional steps are not discussed herein in detail.

Based on the above discussions, it can be seen that the present disclosure offers advantages over conventional methods. It is understood, however, that other embodiments may offer additional advantages, and not all advantages are necessarily disclosed herein, and that no particular advantage is required for all embodiments. One advantage offered by the photoresist material of the present disclosure is that it reduces outgassing of ALG. As discussed above, each ALG monomer is linked to (or protects) a plurality of carboxylic acid function groups. Thus, for the same amount of carboxylic acid to be protected, the amount of outgassed ALG is reduced. Since ALG is a source of contamination for lithography tools and may produce high film stress, the reduction in ALG outgassing improves lithography performance and throughput. In addition, the temperature in the PEB process may be tuned to achieve a higher or a lower contrast for this novel polymer design, where a higher contrast is desirable for critical dimension uniformity, whereas a lower contrast is desirable for depth of focus. Yet another advantage is that the photoresist of the present disclosure does not require additional steps or otherwise place special requirements on the lithography process and system. Therefore, it can be easily implemented without incurring additional cost. It is also understood that the polymer of the photoresist material may apply to either a positive tone developer (basic solution) process or a negative tone developer (organic solvent) process.

One embodiment of the present disclosure pertains to a photoresist that has a polymer. The polymer includes an acid labile group (ALG) that is linked to a plurality of carboxylic acid function groups. The ALG has one of the following chemical formulas:

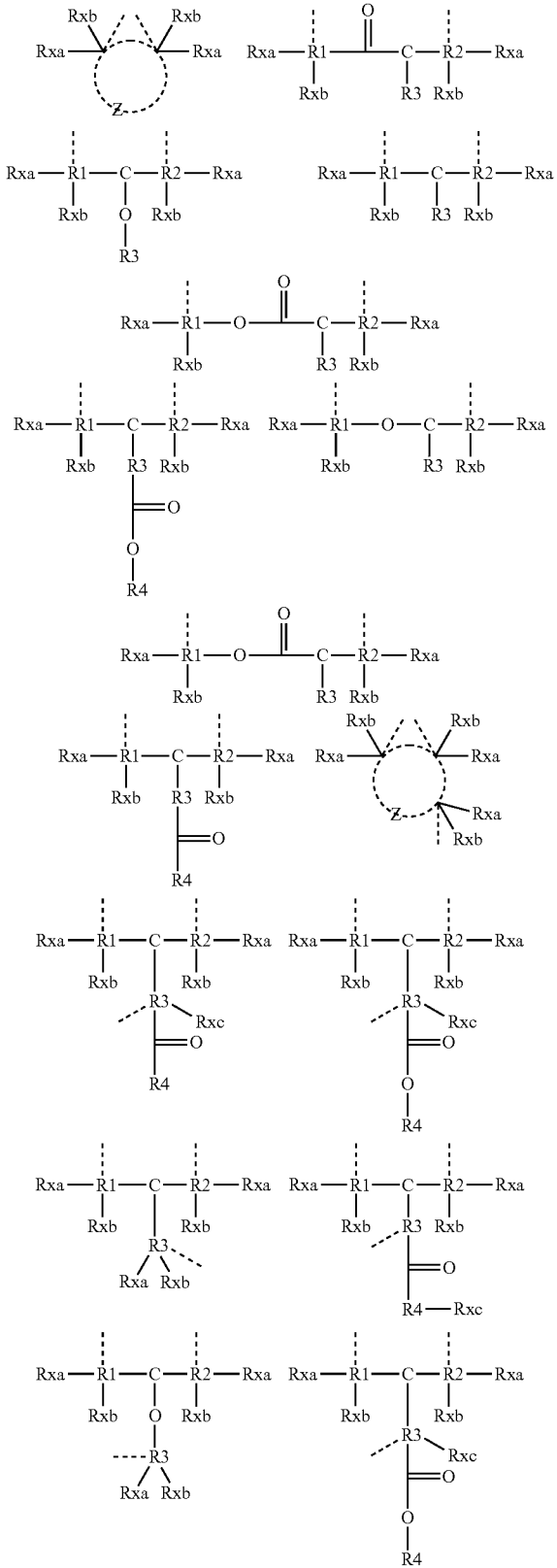

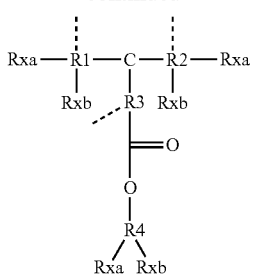

Another embodiment of the present disclosure pertains to a photoresist material. The photoresist material includes a polymer. The polymer includes an acid labile group (ALG) that corresponds to two or three carboxylic acid function groups. The ALG has one of the following chemical formulas:

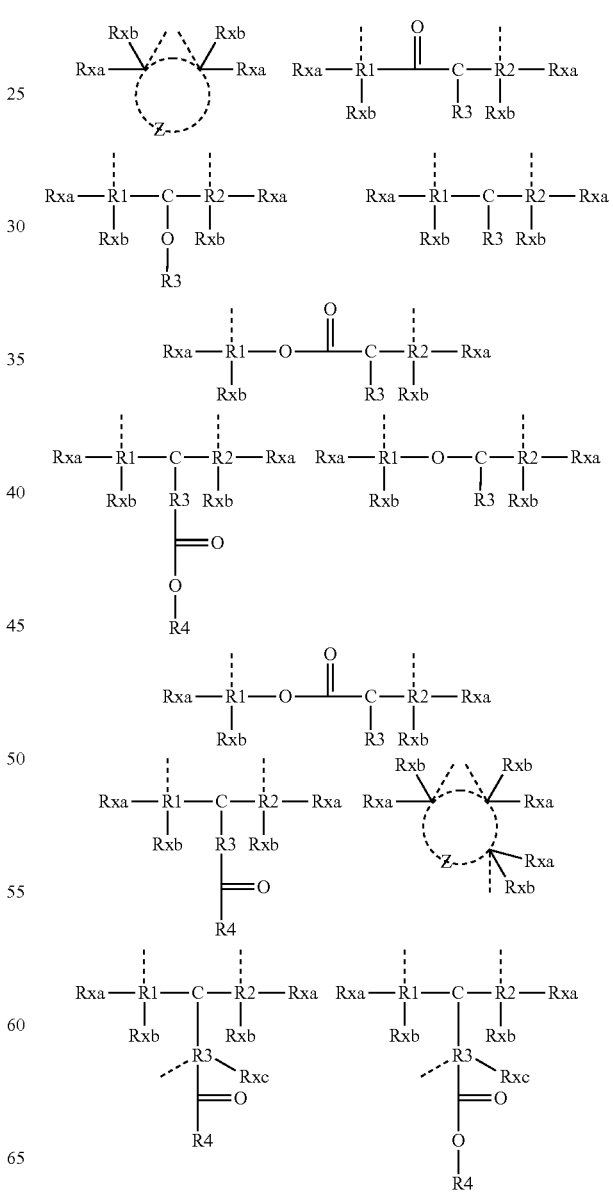

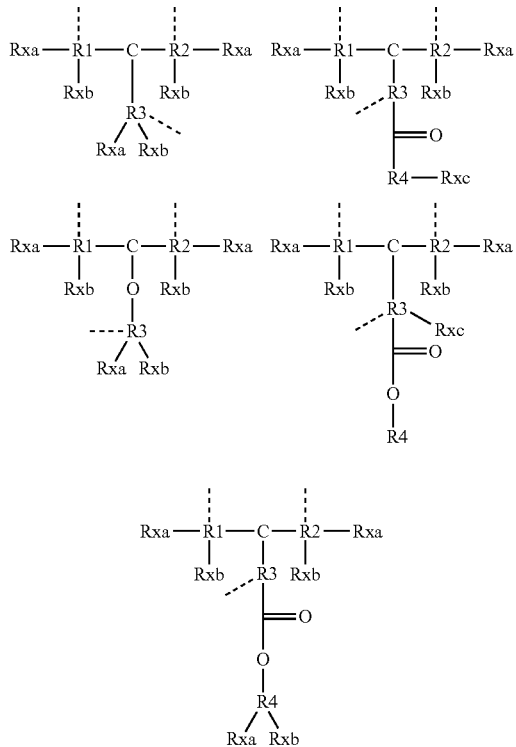

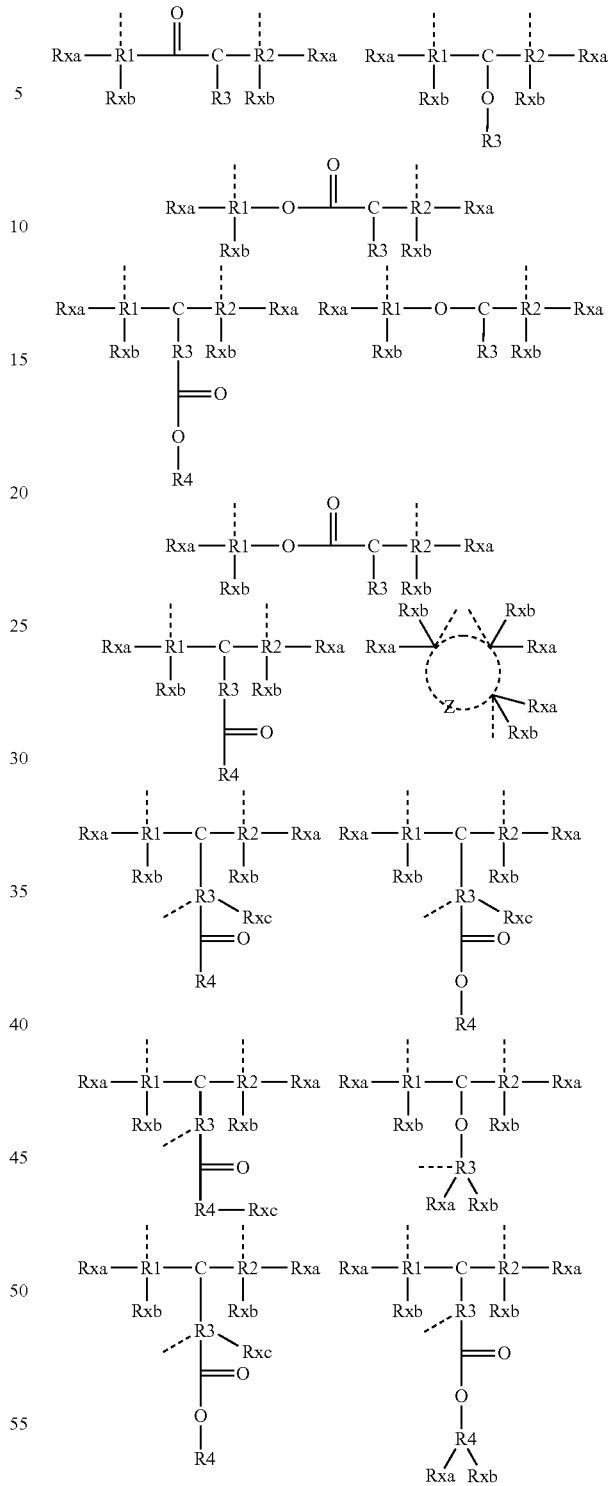

Where Z represents a C4~C15 cyclic alkyl or cyclic alkyl derivative or 3D structure, R1, R2, R3, and R4 each represent a respective C1~C15 alkyl group, and Rxa, Rxb, and Rxc each represent an alkyl group having a carbon number between 1~10.

Yet another embodiment of the present disclosure pertains to a method of fabricating a semiconductor device. A substrate is provided. A material layer is formed on the substrate. A photoresist layer is formed over the material layer. The photoresist layer contains a polymer that includes an acid labile group (ALG) that is linked to a plurality of carboxylic acid function groups. The photoresist layer is patterned using a lithography process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A photoresist material, comprising:
a polymer, wherein the polymer includes an acid labile group (ALG) that is linked to a plurality of carboxylic acid function groups, and wherein the ALG has one of the following chemical formulas:

and wherein:

Z represents a C4~C15 cyclic alkyl or cyclic alkyl derivative;

R1, R2, R3, and R4 each represent a respective C1~C15 alkyl group; and

Rxa, Rxb, and Rxc each represent an alkyl group having a carbon number between 1~10.

2. The photoresist material of claim 1, wherein the photoresist further contains a photo acid generator (PAG) that is configured to release acid in response to an optical exposure.

3. The photoresist material of claim 2, wherein the polymer is configured to be cleaved by the acid in a post-exposure baking process.

4. The photoresist material of claim 3, wherein:
the polymer becomes more hydrophilic after being cleaved by the acid; and
the polymer is dissolvable by a basic solution after becoming more hydrophilic.

5. The photoresist material of claim 1, wherein the ALG is linked to a first carboxylic acid function group via R1 and is linked to a second carboxylic acid function group via R2.

6. The photoresist material of claim 5, wherein the ALG is further linked to a third carboxylic acid function group via R3.

7. A photoresist material, comprising:
a polymer, wherein the polymer includes an acid labile group (ALG) that is linked to two or more carboxylic acid function groups, and wherein the ALG has one of the following chemical formulas:

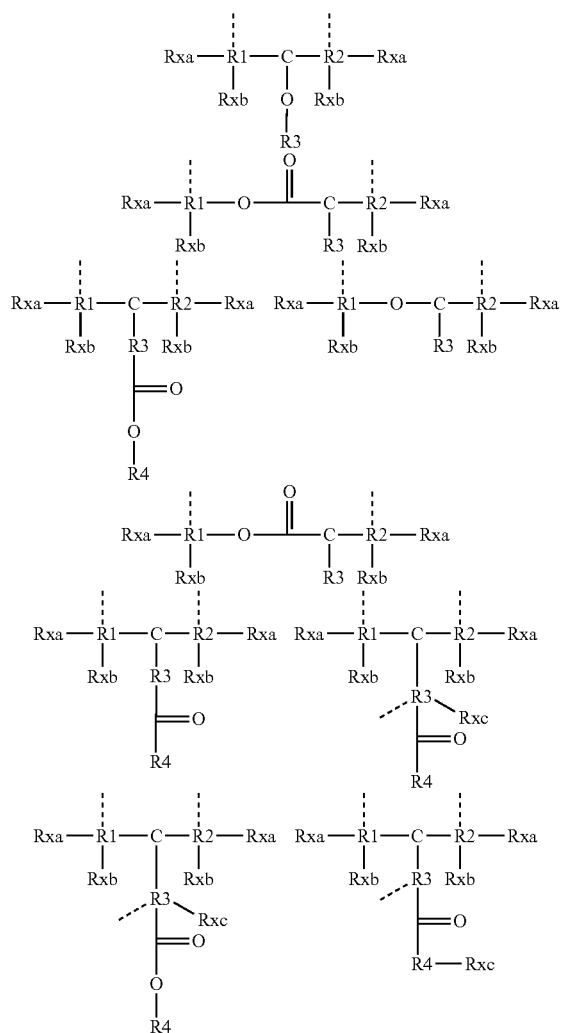

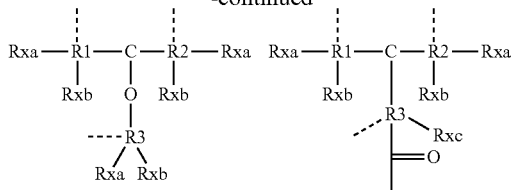

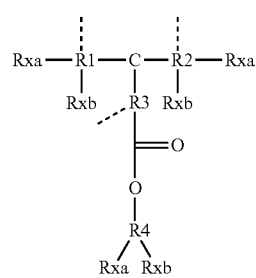

wherein:
Z represents a C4~C15 cyclic alkyl or cyclic alkyl derivative;
R1, R2, R3, and R4 each represent a respective C1~C15 alkyl group; and
Rxa, Rxb, and Rxc each represent an alkyl group having a carbon number between 1~10.

8. The photoresist material of claim 7, wherein:
the photoresist further contains a photo acid generator (PAG) that is configured to release acid; and
the polymer is cleavable by the acid, after which the polymer becomes more hydrophilic and is dissolvable by a basic solution.

9. The photoresist material of claim 7, wherein the polymer is configured to be applied in a positive tone developer process or in a negative tone developer process.

10. The photoresist material of claim 7, wherein the ALG is linked to a first carboxylic acid function group via R1 and is linked to a second carboxylic acid function group via R2.

11. The photoresist material of claim 10, wherein the ALG is further linked to a third carboxylic acid function group via R3.

12. A method of fabricating a semiconductor device, comprising:
providing a substrate;
forming a photoresist layer over the substrate, the photoresist layer containing a polymer that includes an acid labile group (ALG) that is linked to a plurality of carboxylic acid function groups; and
patterning the photoresist layer using a lithography process;
wherein the ALG is linked to two or more carboxylic acid function groups, and wherein the ALG has one of the following chemical formulas:

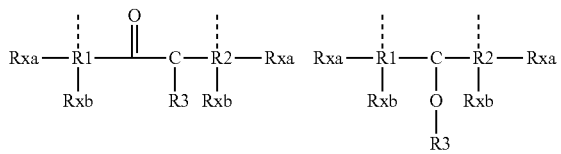

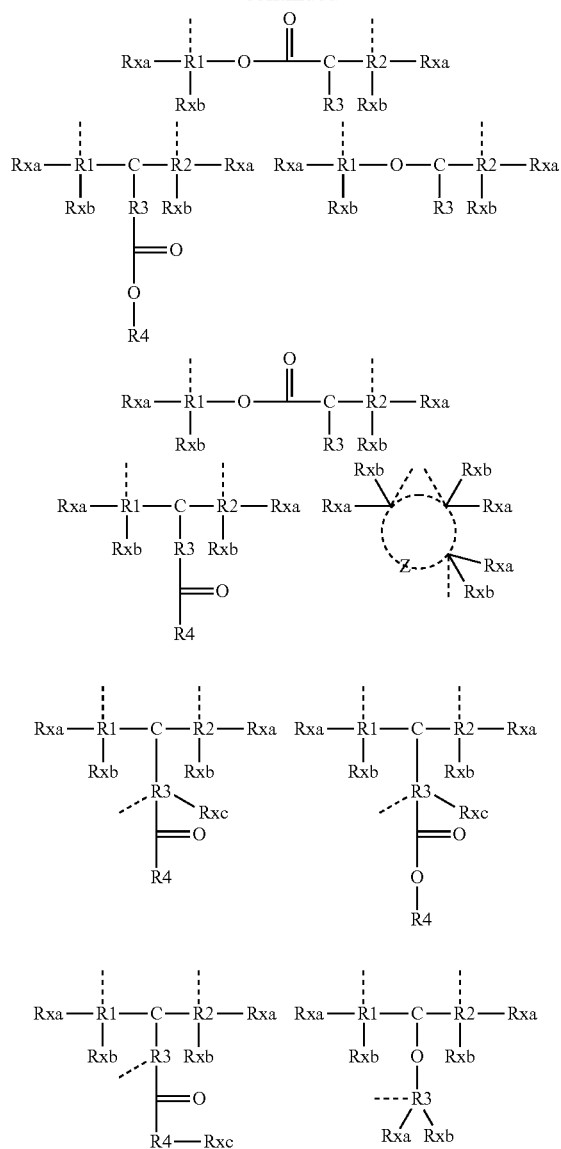

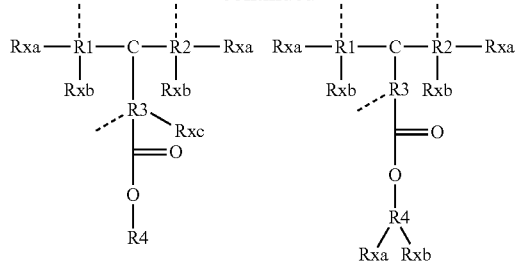

wherein:
Z represents a C4~C15 cyclic alkyl or cyclic alkyl derivative;
R1, R2, R3, and R4 each represent a respective C1~C15 alkyl group; and
Rxa, Rxb, and Rxc each represent an alkyl group having a carbon number between 1~10.

13. The method of claim 12, wherein the lithography process is an extreme ultraviolet (EUV) lithography process.

14. The method of claim 12, further comprising forming a material layer over the substrate, wherein the photoresist layer is formed over the material layer.

15. The method of claim 12, wherein the photoresist further contains a photo acid generator (PAG), and wherein the lithography process comprises:
an optical exposure process in which the PAG releases acid; and
a post-exposure baking process in which the polymer is cleaved by the acid released by the PAG.

16. The method of claim 12, wherein the polymer becomes more hydrophilic after being cleaved by the acid.

17. The method of claim 12, wherein the lithography process further comprises: after the polymer becomes more hydrophilic, dissolving the polymer by a basic solution in a positive tone developer process or by an organic solvent in a negative tone developer process.

18. The method of claim 12, wherein the basic solution contains Tetramethylammonium hydroxide with a concentration of about 2%-3%.

19. The method of claim 12, wherein the ALG is linked to a first carboxylic acid function group via R1 and is linked to a second carboxylic acid function group via R2.

20. The method of claim 19, wherein the ALG is further linked to a third carboxylic acid function group via R3.

* * * * *